United States Patent [19]
Tanabe et al.

[11] Patent Number: 5,550,469
[45] Date of Patent: Aug. 27, 1996

[54] HALL-EFFECT DEVICE DRIVER WITH TEMPERATURE-DEPENDENT SENSITIVITY COMPENSATION

[75] Inventors: Toru Tanabe; Kazuhide Seki, both of Yokohama; Masaaki Hatsumi, Sagamihara, all of Japan

[73] Assignee: Stanley Electric Co., Ltd., Tokyo, Japan

[21] Appl. No.: 208,859

[22] Filed: Mar. 11, 1994

[30] Foreign Application Priority Data

Apr. 2, 1993 [JP] Japan .................. 5-077153

[51] Int. Cl.⁶ .................. G01R 33/06; G01U 3/18; H01L 43/06
[52] U.S. Cl. .................. 324/251; 324/225; 338/32 H
[58] Field of Search .................. 324/207.2, 207.12, 324/251, 225, 224, 252, 207.21; 338/32 R, 32 H; 327/511, 513

[56] References Cited

U.S. PATENT DOCUMENTS

| | | | |
|---|---|---|---|
| 4,034,274 | 7/1977 | Akima | 318/334 |
| 4,371,837 | 2/1983 | Sieverin | 324/251 |
| 4,593,241 | 6/1986 | Evlenberg et al. | 323/294 |
| 4,646,014 | 2/1987 | Evlenberg | 324/225 |
| 4,687,994 | 8/1987 | Fulkerson et al. | 324/251 |
| 4,734,594 | 3/1988 | Nelson | 327/511 |
| 4,760,285 | 7/1988 | Nelson | 327/511 |
| 4,966,041 | 10/1990 | Miyazaki | 324/225 X |

*Primary Examiner*—Sandra L. O'Shea
*Assistant Examiner*—Roger Philips
*Attorney, Agent, or Firm*—Fish & Richardson P.C.

[57] ABSTRACT

A Hall-effect device for detecting a magnetic flux intensity has a pair of input terminals connected respectively to a constant-voltage regulated power supply and an FET. The FET has a gate connected to the output terminal of an operational amplifier. One of the input terminals of the operational amplifier is connected to the junction between a variable resistor and a temperature-dependent variable resistor which jointly serve as a voltage divider. The temperature-dependent variable resistor has a temperature characteristic of resistance which is opposite to the temperature characteristic of sensitivity of the Hall-effect device. When the ambient temperature varies, the sensitivity of the Hall-effect device also varies, and so does the resistance of the temperature-dependent variable resistor. The divided voltage applied from the voltage divider to the operational amplifier drops, lowering the voltage applied to the gate of the FET. The internal resistance of the FET also decreases to lower a drive current flowing through the Hall-effect device for thereby compensating a temperature-dependent sensitivity change of the Hall-effect device. Therefore, the sensitivity of the Hall-effect device remains constant.

12 Claims, 8 Drawing Sheets

HALL-EFFECT DEVICE DRIVER WITH TEMPERATURE-DEPENDENT SENSITIVITY COMPENSATION

BACKGROUND OF THE INVENTION

1. Field of the Invention

The present invention relates to a Hall-effect device driver for use in a magnetic sensor, a magnetic recording medium reader, or the like, for correcting the temperature characteristic of sensitivity of a Hall-effect device to produce a detected signal having a voltage level which is accurately representative of a magnetic flux intensity.

2. Description of the Prior Art

Hall-effect devices detect magnetic fluxes and output a voltage corresponding to the intensity thereof according to the Hall effect. It has heretofore been known that if a Hall-effect device comprises a thin film of GaAs semiconductor, then the voltage of a detected signal produced from its output terminal depending on the magnetic fluxes that are applied tends to vary due to varying characteristics of the GaAs semiconductor. To avoid such detected voltage variations, it has been customary to adjust the drive current supplied to the Hall-effect device when the detected signal is amplified. For the drive current adjustment, a driver circuit for producing a predetermined output voltage with respect to a given magnetic flux intensity is integrally fabricated in combination with the Hall-effect device as an integrated circuit. The drive current for the Hall-effect device is adjusted by the driver circuit to provide an initial current setting at the time the Hall-effect device is manufactured and also to compensate, from time to time, for time-dependent changes in the drive current so that the Hall-effect device can produce a desired output voltage.

FIG. 1 of the accompanying drawings shows a conventional Hall-effect device driver, which is generally designated by the reference numeral 1, for driving a Hall-effect device 2 having an input terminal 2a connected to a constant-voltage regulated power supply Vcc. As shown in FIG. 1, the conventional Hall-effect device driver 1 includes a field-effect transistor (FET) 3 having a source connected to another input terminal 2b of the Hall-effect device 2, and a resistor RY connected between the drain of the FET 3 and ground. The conventional Hall-effect device driver 1 also has an operational amplifier 4 having an output terminal connected to the gate of the FET 3 and an inverting input terminal connected to the drain of the FET 3, for supplying a setting voltage for setting a drive current I, a voltage divider composed of a variable resistor VR and a resistor RX which are connected in series between the constant-voltage regulated power supply Vcc and ground, for applying a variable divided voltage to the noninverting input terminal of the operational amplifier 4, and impedance-matching resistors R1, R2 connected respectively to output terminals 2c, 2d of the Hall-effect device 2.

The conventional Hall-effect device driver 1 further includes an operational amplifier 5 having noninverting and inverting input terminals connected respectively to the resistors R1, R2, and connected across an amplification factor setting resistor R3, for amplifying a detected signal from the Hall-effect device 2 and outputting the amplified signal, and an operational amplifier 6 for applying a preset voltage to the inverting input terminal of the operational amplifier 5 to allow the operational amplifier 5 to amplify the detected signal at a predetermined amplification factor. Furthermore, the conventional Hall-effect device driver 1 has an impedance-matching resistor R4 connected between the output terminal of the operational amplifier 6 and the inverting input terminal of the operational amplifier 5, resistors R5, R6 connected in series between the constant-voltage regulated power supply Vcc and ground, for applying a divided voltage to the inverting input terminal of the operational amplifier 6, and an output terminal 7 for outputting the amplified detected signal from the operational amplifier 5. The Hall-effect device driver 1 and the Hall-effect device 2 are integrally fabricated as an integrated circuit.

The conventional Hall-effect device driver 1 operates as follows:

When a drive current I is supplied from the constant-voltage regulated power supply Vcc to the Hall-effect device 2, the drive current I flows from the input terminal 2a through the Hall-effect device 2 to the input terminal 2b, from which it flows through the source and drain of the FET 3 and the resistor RY. The Hall-effect device 2 is now energized by the supplied drive current I. When magnetic fluxes are applied to the Hall-effect device 2, the Hall-effect device 2 develops a detected signal across the output terminals 2c, 2d. The detected signal is supplied through the resistors R1, R2 to the operational amplifier 5. The operational amplifier 5 amplifies the applied signal at an amplification factor that has been set by the operational amplifier 6, and outputs the amplified signal from the output terminal 7. The drive current I flowing through the Hall-effect device 2 is controlled as follows: the voltage from the constant-voltage regulated power supply Vcc is variably divided by the variable resistor VR and the resistor RX, and the variably divided voltage is applied to the noninverting input terminal of the operational amplifier 4. To the inverting input terminal of the operational amplifier 4, there is applied a voltage from a junction between the FET 3 and the resistor RY, i.e., a voltage drop developed across the Hall-effect device 2 when the drive current I flows therethrough. These voltages applied to the inverting and noninverting input terminals, respectively, of the operational amplifier 4 serve to control the drive current I that flows through the FET 3 into a predetermined constant value.

The drive current I can thus be adjusted to a predetermined constant value to provide an initial current setting at the time the Hall-effect device 2 is manufactured and also to compensate, from time to time, for time-dependent changes in the drive current I.

If the Hall-effect device 2 is made of a GaAs semiconductor, for example, it has a negative temperature characteristic of sensitivity whose curve has a gradient of about −600 ppm (percent per million). Therefore, the voltage level of the detected signal from the output terminals 2c, 2d of the Hall-effect device 2 varies as the ambient temperature varies. When the voltage level of the detected signal varies with temperature, it does not accurately represent the intensity of magnetic fluxes applied to the Hall-effect device 2.

SUMMARY OF THE INVENTION

It is therefore an object of the present invention to provide a Hall-effect device driver which can compensate for the temperature characteristics of a Hall-effect device to produce a flux-detected signal having an accurate voltage level corresponding to a magnetic flux intensity without being affected by changes in the ambient temperature.

Another object of the present invention is to provide a Hall-effect device driver which is of a relatively simple structure to compensate for the temperature characteristics of a Hall-effect device to produce a flux-detected signal having an accurate voltage level corresponding to a magnetic flux intensity.

According to the present invention, there is provided a Hall-effect device driver comprising a semiconductor having an internal resistance connected in series to one of a pair of voltage-applying terminals of a Hall-effect device which has a positive or negative temperature characteristic of sensitivity, the internal resistance being variable depending on an input voltage applied thereto, a temperature-dependent variable resistor having a temperature characteristic of resistance which is opposite to the positive or negative temperature characteristic of sensitivity of the Hall-effect device, and voltage converting means for converting a change in the resistance of the temperature-dependent variable resistor into a voltage change and applying the voltage change as the input voltage to the semiconductor device for correcting the positive or negative temperature characteristic of sensitivity of the Hall-effect device.

The voltage converting means may comprise an operational amplifier, and the Hall-effect device driver may further comprise a resistor connected to limit a drive current flowing through the Hall-effect device, and a variable resistor connected to the temperature-dependent variable resistor to divide a voltage and apply the divided voltage to an input terminal of the operational amplifier, the semiconductor device being connected to the operational amplifier such that a voltage drop developed across the resistor to another input terminal of the operational amplifier, whereby the drive current flowing through the Hall-effect device is controlled so as to be constant by the semiconductor device. The Hall-effect device driver may further comprise a second temperature-dependent variable resistor connected parallel to the first-mentioned temperature-dependent variable resistor and in series with the variable resistor. The semiconductor device may comprise a field-effect transistor having a source connected to one of the voltage-applying terminals of the Hall-effect device, and a drain connected to ground through the resistor.

The voltage converting means may comprise an operational amplifier, the temperature-dependent variable resistor being connected to limit a drive current flowing through the Hall-effect device, and the Hall-effect device driver may further comprise a resistor and a variable resistor connected thereto to divide a voltage and apply the divided voltage to an input terminal of the operational amplifier, the semiconductor device being connected to the operational amplifier such that a voltage drop developed across the temperature-dependent variable resistor to another input terminal of the operational amplifier, whereby the drive current flowing through the Hall-effect device is controlled so as to be constant by the semiconductor device. The Hall-effect device driver may further comprise a second temperature-dependent variable resistor connected parallel to the first-mentioned temperature-dependent variable resistor and in series with the semiconductor device. Alternatively, the Hall-effect device driver may further comprise a thermistor connected parallel to the temperature-dependent variable resistor and in series with the semiconductor device. The semiconductor device may comprise a field-effect transistor having a source connected to one of the voltage-applying terminals of the Hall-effect device, and a drain connected to ground through the temperature-dependent variable resistor.

According to the present invention, there is also provided a Hall-effect device driver comprising a semiconductor having an internal resistance connected in series to one of a pair of voltage-applying terminals of a Hall-effect device which has a positive or negative temperature characteristic of sensitivity, the internal resistance being variable depending on an input voltage applied thereto, a constant-voltage diode having a temperature characteristic of resistance which is opposite to the positive or negative temperature characteristic of sensitivity of the Hall-effect device, and voltage converting means for converting a change in the voltage across the constant-voltage diode into a voltage change and applying the voltage change as the input voltage to the semiconductor device for correcting the positive or negative temperature characteristic of sensitivity of the Hall-effect device.

The temperature-dependent variable resistor, the second temperature-dependent variable resistor, the thermistor, or the constant-voltage diode may be substantially joined to the Hall-effect device.

With the above arrangements, a change in the resistance of the temperature-dependent variable resistor, which has a temperature characteristic of resistance opposite to the positive or negative temperature characteristic of sensitivity of the Hall-effect device, is converted into a voltage change, and the converted voltage is applied as an input voltage to the semiconductor device connected to the input terminals of the Hall-effect device to compensate for a temperature-dependent change in the sensitivity of the Hall-effect device according to the positive or negative temperature characteristic thereof. Thus, the temperature characteristic of sensitivity of the Hall-effect device can accurately be corrected to produce a flux-detected signal having an accurate voltage level which represents the intensity of magnetic fluxes to be measured, without being adversely affected by the ambient temperature.

According to the present invention, there is further provided a Hall-effect device driver comprising amplifying means for amplifying a detected signal from a pair of output terminals of a Hall-effect device which has a positive or negative temperature characteristic of sensitivity, and a temperature-dependent variable resistor connected between the output terminals of the Hall-effect device and an input terminal of the amplifying means and having a temperature characteristic of resistance which is opposite to the positive or negative temperature characteristic of sensitivity of the Hall-effect device, for varying the level of an output signal from the amplifying means to correct the positive or negative temperature characteristic of sensitivity of the Hall-effect device.

According to the present invention, there is further provided a Hall-effect device driver comprising amplifying means for amplifying a detected signal from a pair of output terminals of a Hall-effect device which has a positive or negative temperature characteristic of sensitivity, and a temperature-dependent variable resistor connected across the amplifying means to determine an amplification factor thereof and having a temperature characteristic of resistance which is opposite to the positive or negative temperature characteristic of sensitivity of the Hall-effect device, for varying the level of an output signal from the amplifying means to correct the positive or negative temperature characteristic of sensitivity of the Hall-effect device.

With the above arrangements, a flux-detected signal produced from the output terminals of the Hall-effect device is supplied to the amplifier through the temperature-dependent variable resistor, or the temperature-dependent variable resistor is used to determine the amplification factor of the amplifier, thereby to correct the temperature characteristic of the Hall-effect device. Therefore, the Hall-effect device driver is simpler in arrangement, and yet can accurately correct the temperature characteristic of sensitivity of the Hall-effect device to produce a flux-detected signal having an accurate voltage level which represents the intensity of magnetic fluxes to be measured.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
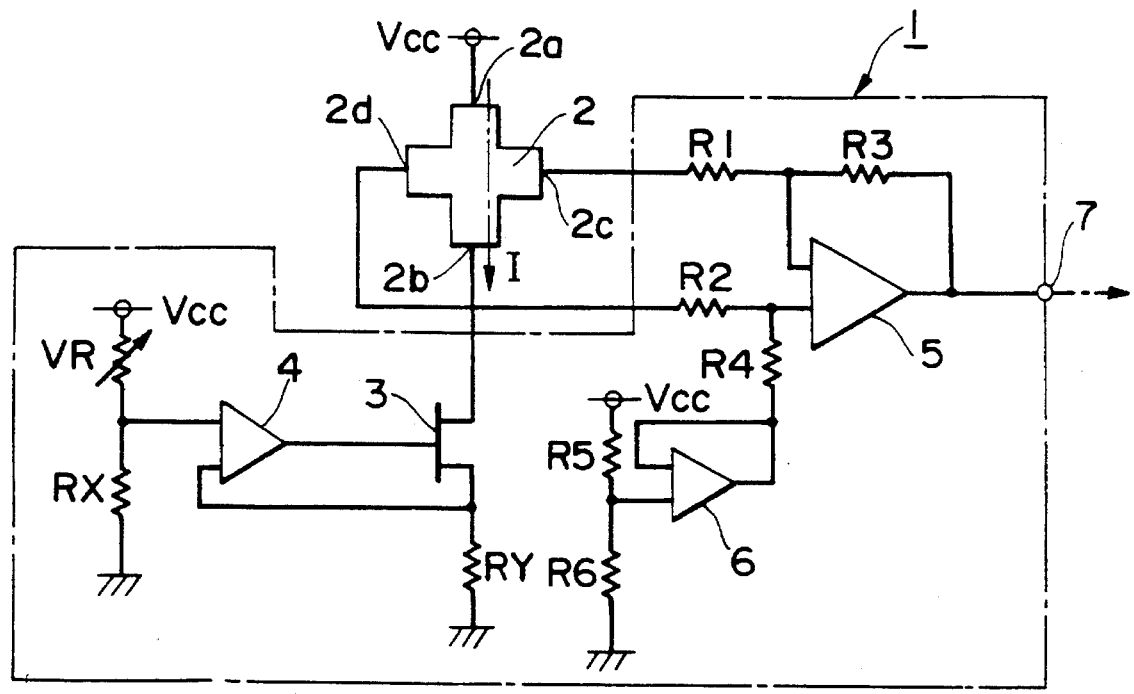
FIG. 1 is a circuit diagram of a conventional Hall-effect device driver.
Figure 2:
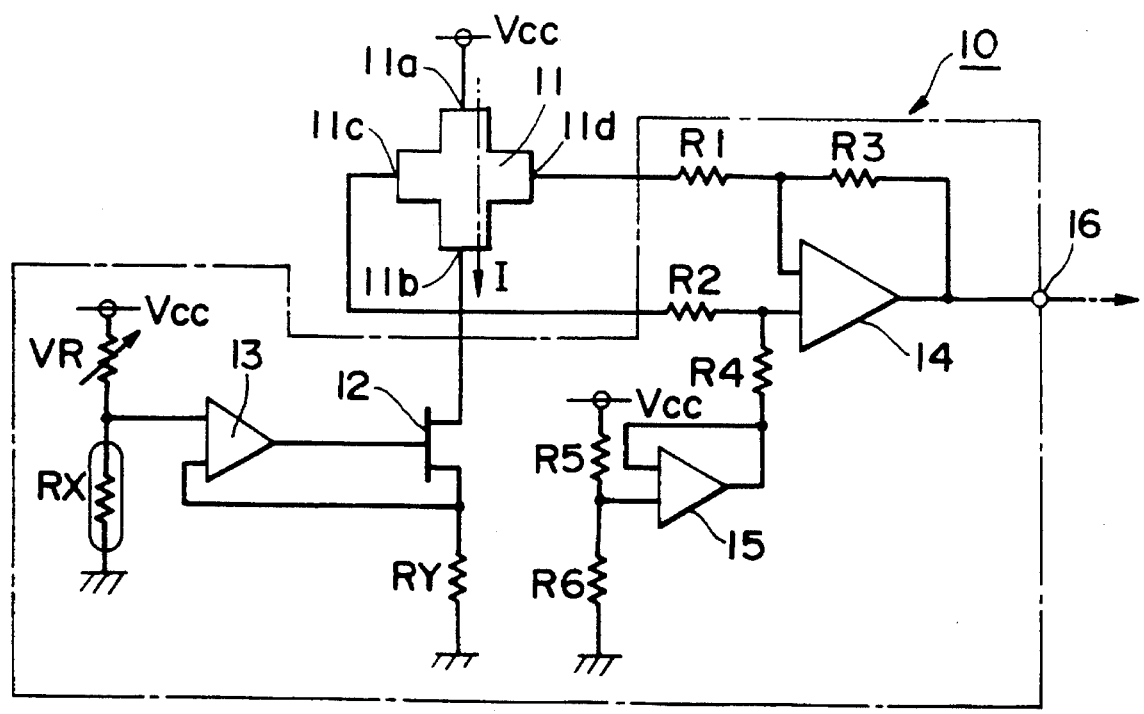
FIG. 2 is a circuit diagram of a Hall-effect device driver according to a first embodiment of the present invention.

As shown in FIG. 2, a Hall-effect device driver 10 according to a first embodiment of the present invention drives a Hall-effect device 11 having an input terminal 11a connected to a constant-voltage regulated power supply Vcc. As shown in FIG. 2, the Hall-effect device driver 10 includes an FET 12 having a source connected to another input terminal 11b of the Hall-effect device 11, and a resistor RY connected between the drain of the FET 12 and ground. The Hall-effect device driver 10 also has an operational amplifier 13 having an output terminal connected to the gate of the FET 12 and an inverting input terminal connected to the drain of the FET 12, for supplying a setting voltage for setting a drive current I, a voltage divider composed of a variable resistor VR and a resistor RX which are connected in series between the constant-voltage regulated power supply Vcc and ground, for applying a variable divided voltage to the noninverting input terminal of the operational amplifier 4. The resistor RX comprises a linear resistor, such as a posistor, which has a positive temperature characteristic of resistance whose curve has a gradient of about +600 ppm, which is opposite to the negative temperature characteristic of sensitivity of the Hall-effect device 11, whose curve has a gradient of about −600 ppm if the Hall-effect device 11 is made of a GaAs semiconductor.

The Hall-effect device driver 10 further includes impedance-matching resistors R1, R2 connected respectively to output terminals 11c, 11d of the Hall-effect device 11, an operational amplifier 14 having noninverting and inverting input terminals connected respectively to the resistors R1, R2, and connected across an amplification factor setting resistor R3, for amplifying a detected signal from the Hall-effect device 11 and outputting the amplified signal, and an operational amplifier 15 for applying a preset voltage to the inverting input terminal of the operational amplifier 14 to allow the operational amplifier 14 to amplify the detected signal at a predetermined amplification factor. Furthermore, the Hall-effect device driver 10 has an impedance-matching resistor R4 connected between the output terminal of the operational amplifier 15 and the inverting input terminal of the operational amplifier 14, resistors R5, R6 connected in series between the constant-voltage regulated power supply Vcc and ground, for applying a divided voltage to the inverting input terminal of the operational amplifier 15, and an output terminal 16 for outputting the amplified detected signal from the operational amplifier 14. The Hall-effect device driver 11 and the Hall-effect device 11 are integrally fabricated as an integrated circuit.

Operation of the Hall-effect device driver 11 according to the first embodiment will be described below.

When a drive current I is supplied from the constant-voltage regulated power supply Vcc to the Hall-effect device 11, the drive current I flows from the input terminal 11a through the Hall-effect device 11 to the output terminal 11b, from which it flows through the source and drain of the FET 12 and the resistor RY. The Hall-effect device 11 is now energized by the supplied drive current I. When magnetic fluxes are applied to the Hall-effect device 11, the Hall-effect device 11 develops a detected signal across the output terminals 11c, 11d. The detected signal is supplied through the resistors R1, R2 to the operational amplifier 14. The operational amplifier 14 amplifies the applied signal at an amplification factor that has been set by the operational amplifier 15, and outputs the amplified signal from the output terminal 16. The drive current I flowing through the Hall-effect device 11 is controlled as follows: The voltage from the constant-voltage regulated power supply Vcc is variably divided by the variable resistor VR and the resistor RX, and the variably divided voltage is applied to the noninverting input terminal of the operational amplifier 13. To the inverting input terminal of the operational amplifier 13, there is applied a voltage from a junction between the FET 12 and the resistor RY, i.e., a voltage drop developed across the Hall-effect device 11 when the drive current I flows therethrough. These voltages applied to the inverting and noninverting input terminals, respectively, of the operational amplifier 13 serve to control the drive current I that flows through the FET 12 into a predetermined constant value.

When the ambient temperature around the Hall-effect device 11 and the Hall-effect device driver 10 varies, the sensitivity of the Hall-effect device 11 also varies according to its temperature characteristic curve which has a gradient of −600 ppm, for example. As the ambient temperature rises, the voltage level of the detected signal outputted from the output terminals 11c, 11d of the Hall-effect device 11 decreases. At the same time, the resistance of the resistor RX also varies, i.e., increases according to its temperature characteristic curve which has a gradient of +600 ppm, for example. Therefore, the variably divided voltage produced by the variable resistor VR and the resistor RX is lowered, thus reducing the voltage applied from the operational amplifier 13 to the gate of the FET 12. Since the internal resistance of the FET 12 is lowered, the drive current I flowing through the Hall-effect device 11 is also reduced. Consequently, the temperature-dependent sensitivity change of the Hall-effect device 11 is compensated for thereby to keep the sensitivity of the Hall-effect device 11 at a constant level. The voltage level of the detected signal from the output terminals 11c, 11d is thus maintained constant.

Figure 3:
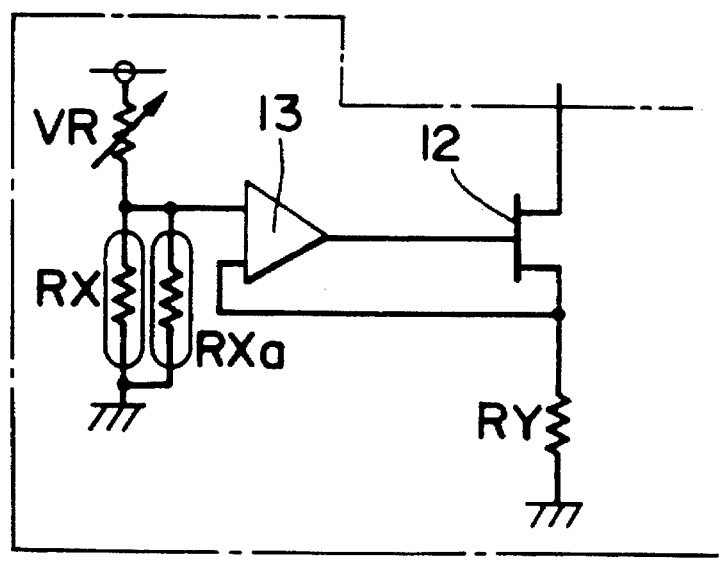
FIG. 3 is a fragmentary circuit diagram of a Hall-effect device driver according to a second embodiment of the present invention.

FIG. 3 fragmentarily shows a Hall-effect device driver according to a second embodiment of the present invention. The Hall-effect device driver shown in FIG. 3 has a resistor RX having a relatively large temperature characteristic of resistance which is opposite to the temperature characteristic of sensitivity of the Hall-effect device 11 (see FIG. 2). For example, the resistor RX has a positive temperature characteristic of resistance whose curve has a gradient of about +1500 ppm. The Hall-effect device driver shown in FIG. 3 also has a resistor RXa connected parallel to the resistor RX and having a very small temperature characteristic of resistance. The other structural details of the Hall-effect device driver shown in FIG. 3 are identical to those of the Hall-effect device driver shown in FIG. 2, and are omitted from illustration.

The Hall-effect device driver according to the second embodiment shown in FIG. 3 operates as follows:

The Hall-effect device driver shown in FIG. 3 operates basically in the same manner as the Hall-effect device driver shown in FIG. 2. If the resistor RXa has a resistance of 1 kΩ and substantially no temperature characteristic of resistance, then the resistors RX, RXa jointly provide a positive temperature characteristic of resistance whose curve has a gradient of about +750 ppm. In this manner, a desired temperature characteristic of resistance can be obtained by selecting an appropriate value for the resistance of the resistor RXa.

Figure 4:
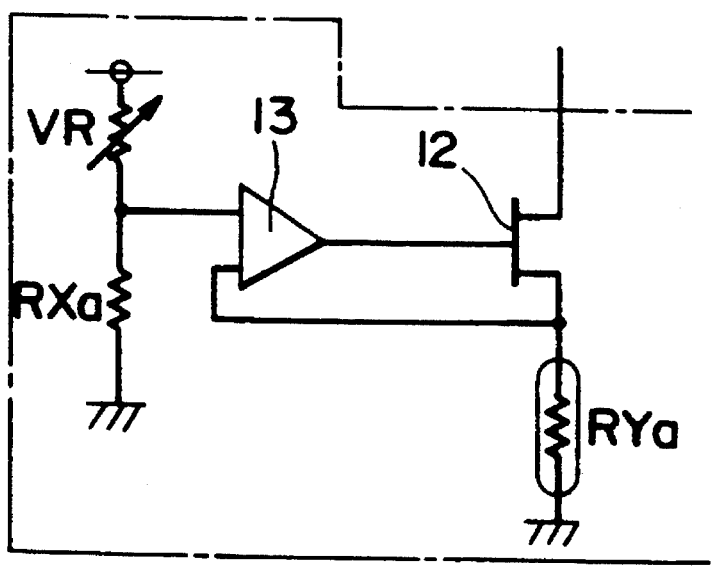
FIG. 4 is a fragmentary circuit diagram of a Hall-effect device driver according to a third embodiment of the present invention.

FIG. 4 fragmentarily shows a Hall-effect device driver according to a third embodiment of the present invention. The Hall-effect device driver shown in FIG. 4 has a resistor RXa connected in place of the resistor RX shown in FIG. 2, the resistor RXa having its resistance remaining unchanged depending on the ambient temperature. The Hall-effect device driver shown in FIG. 4 also includes a resistor RYa connected in place of the resistor RY shown in FIG. 2. The resistor RYa has the same temperature characteristic of resistance as the temperature characteristic of sensitivity of the Hall-effect device 11 (see FIG. 2). For example, if the Hall-effect device 11 has a negative temperature characteristic of sensitivity whose curve has a gradient of about −600 ppm, then the resistor RYa has a negative temperature characteristic of resistance whose curve has a gradient of about −600 ppm. The other structural details of the Hall-effect device driver shown in FIG. 4 are identical to those of the Hall-effect device driver shown in FIG. 2, and are omitted from illustration.

The Hall-effect device driver according to the third embodiment shown in FIG. 4 operates as follows:

The Hall-effect device driver shown in FIG. 4 operates basically in the same manner as the Hall-effect device driver shown in FIG. 2. When the ambient temperature around the Hall-effect device 11 and the Hall-effect device driver vary, the sensitivity of the Hall-effect device 11 also varies, and so does the drive current I. At the same time, the resistance of the resistor RYa also varies. More specifically, when the temperature increases, the drive current I decreases. The resistance of the resistor RYa is lowered, thus increasing the drive current I. As the voltage fed back to the operational amplifier 13 varies, the voltage applied to the gate of the FET 12 varies in a manner to cancel out the temperature-dependent sensitivity change of the Hall-effect device 11. Consequently, the temperature-dependent sensitivity change of the Hall-effect device 11 is compensated for thereby to keep the sensitivity of the Hall-effect device 11 constant.

Figure 5:
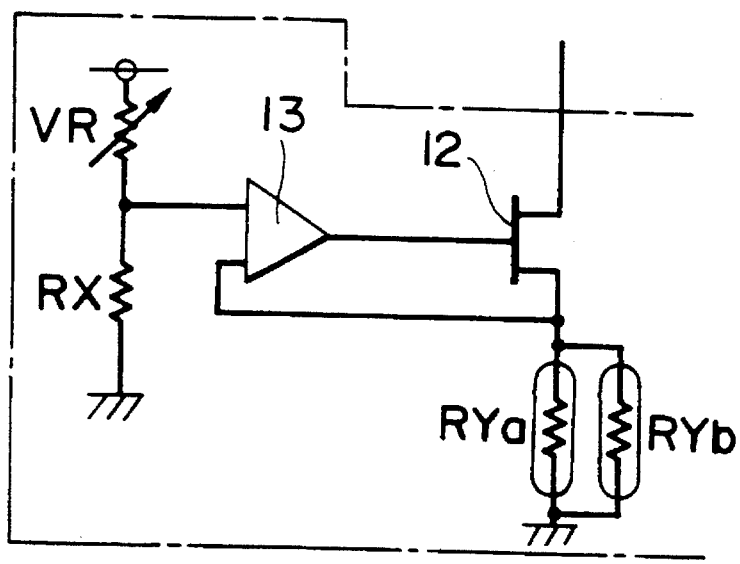
FIG. 5 is a fragmentary circuit diagram of a Hall-effect device driver according to a fourth embodiment of the present invention.

FIG. 5 fragmentarily shows a Hall-effect device driver according to a fourth embodiment of the present invention. The Hall-effect device drive shown in FIG. 5 has a resistor RX connected to the variable resistor VR and having no temperature characteristic of resistance. The Hall-effect device drive shown in FIG. 5 also has a resistor RYa connected in place of the resistor RY shown in FIG. 2. The resistor RYa has a temperature characteristic of resistance which is relatively large with respect to the temperature characteristic of resistance of the Hall-effect device 11 (see FIG. 2). For example, the resistor RYa has a negative temperature characteristic of resistance whose curve has a gradient of about −1250 ppm, and may comprise a platinum resistor, for example. A resistor RYb having a very small temperature characteristic of resistance is connected parallel to the resistor RYa. The other structural details of the Hall-effect device driver shown in FIG. 5 are identical to those of the Hall-effect device driver shown in FIG. 2, and are omitted from illustration.

In the Hall-effect device driver shown in FIG. 5, a desired temperature characteristic of resistance can be obtained by selecting an appropriate value for the resistance of the resistor RYb.

Figure 6:
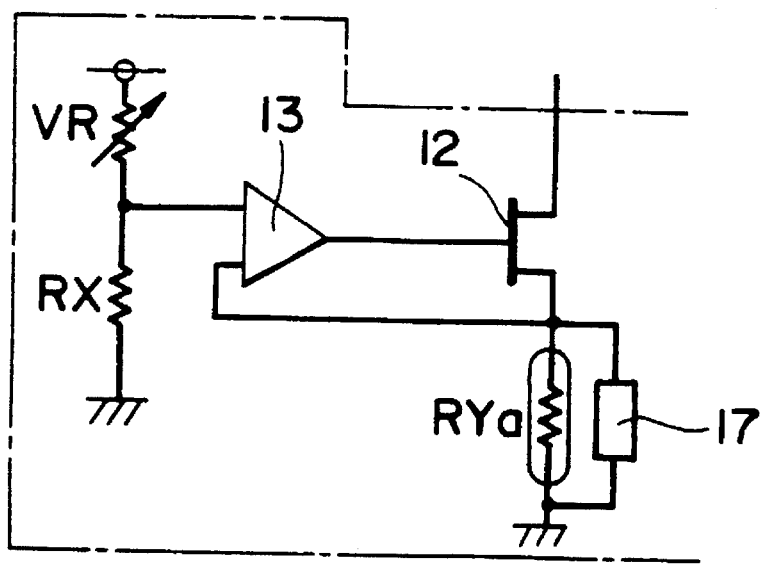
FIG. 6 is a fragmentary circuit diagram of a modification of the Hall-effect device driver according to the fourth embodiment of the present invention.

As shown in FIG. 6, the resistor RYb shown in FIG. 5 may be replaced with a thermistor 17 having a negative temperature characteristic of resistance.

Figure 7:
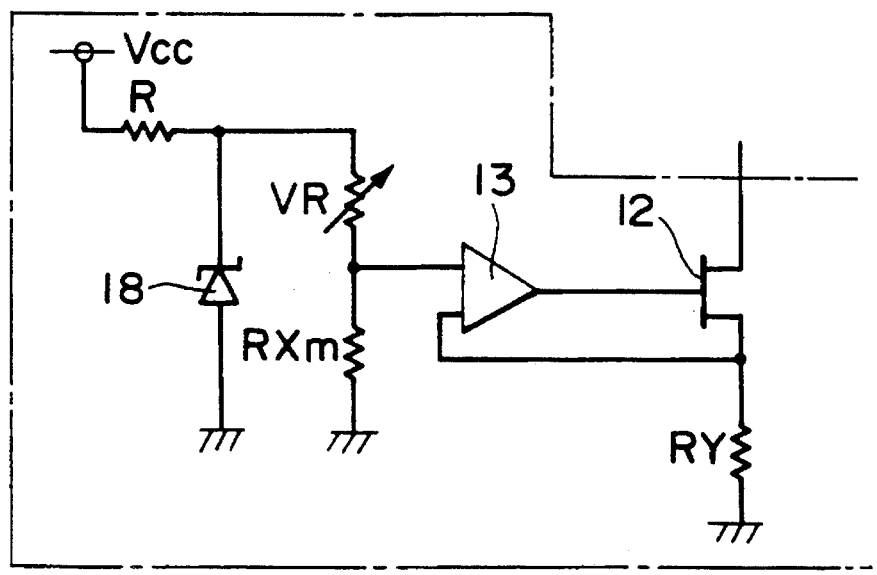
FIG. 7 is a fragmentary circuit diagram of a Hall-effect device driver according to a fifth embodiment of the present invention.

FIG. 7 fragmentarily shows a Hall-effect device driver according to a fifth embodiment of the present invention. The Hall-effect device drive shown in FIG. 7 has a resistor RXm connected in place of the resistor RX shown in FIG. 2, the resistor RXm having no temperature characteristic of resistance. The Hall-effect device drive shown in FIG. 7 also has a constant-voltage diode 18, such as a zener diode, connected parallel to the series-connected resistors VR, RXm, the constant-voltage diode 18 having a positive temperature characteristic of resistance. A resistor R having no temperature characteristic of resistance is connected between the constant-voltage regulated power supply Vcc and the constant-voltage diode 18. The other structural details of the Hall-effect device driver shown in FIG. 7 are identical to those of the Hall-effect device driver shown in FIG. 2, and are omitted from illustration.

Operation of the Hall-effect device driver shown in FIG. 7 will be described below.

The Hall-effect device driver shown in FIG. 7 operates basically in the same manner as the Hall-effect device driver shown in FIG. 2. When the ambient temperature around the Hall-effect device 11 and the Hall-effect device driver vary, the resistance of the constant-voltage diode 18 also varies according to its positive resistance temperature characteristic. Therefore, the voltage across the constant-voltage diode 18 also varies with the ambient temperature. The voltage divided by the resistors VR, RXm also varies. Consequently, the drive current I flowing through the Hall-effect device 11 also varies with the temperature in the same manner as when the resistance of the resistors RX, RXa shown in FIG. 3 varies with the temperature. The temperature-dependent sensitivity change of the Hall-effect device 11 is thus compensated for thereby to keep the sensitivity of the Hall-effect device 11 constant.

Figure 8:
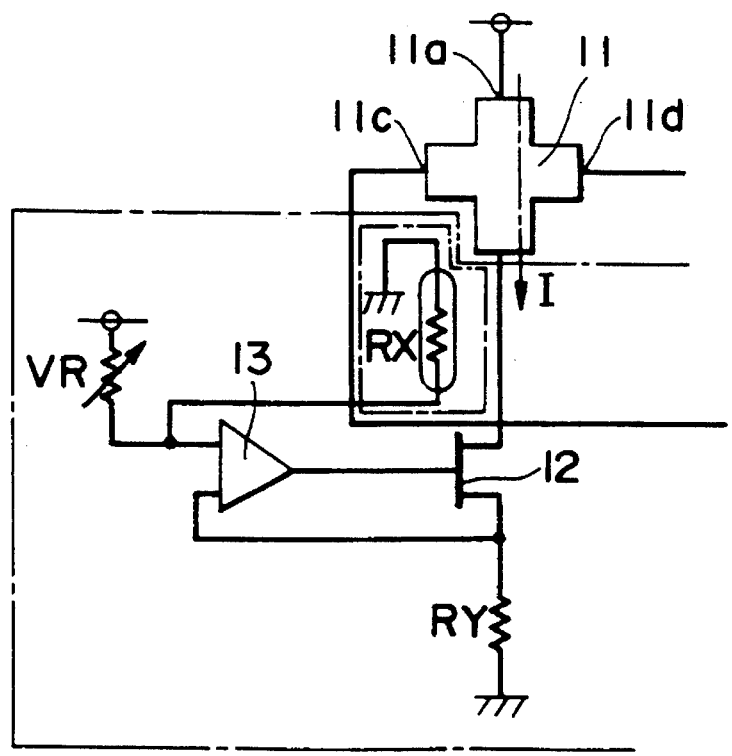
FIG. 8 is a fragmentary circuit diagram of a Hall-effect device driver according to a sixth embodiment of the present invention.

FIG. 8 fragmentarily shows a Hall-effect device driver according to a sixth embodiment of the present invention. In the Hall-effect device drive shown in FIG. 8, the resistor RX shown in FIG. 2, which has a temperature characteristic of resistance, is positioned highly closely to the Hall-effect device 11, e.g., is joined to the Hall-effect device 11. Therefore, even when the Hall-effect device 11 and the Hall-effect device driver shown in FIG. 8 are physically spaced from each other and suffer different temperature changes, the resistance of the resistor RX varies directly commensurately with the temperature-dependent change in the sensitivity of the Hall-effect device 11. Accordingly, the temperature-dependent change in the sensitivity of the Hall-effect device 11 can accurately be compensated for. The Hall-effect device drive shown in FIG. 8 operates in the same manner as the Hall-effect device drive shown in FIG. 2.

Figure 9:
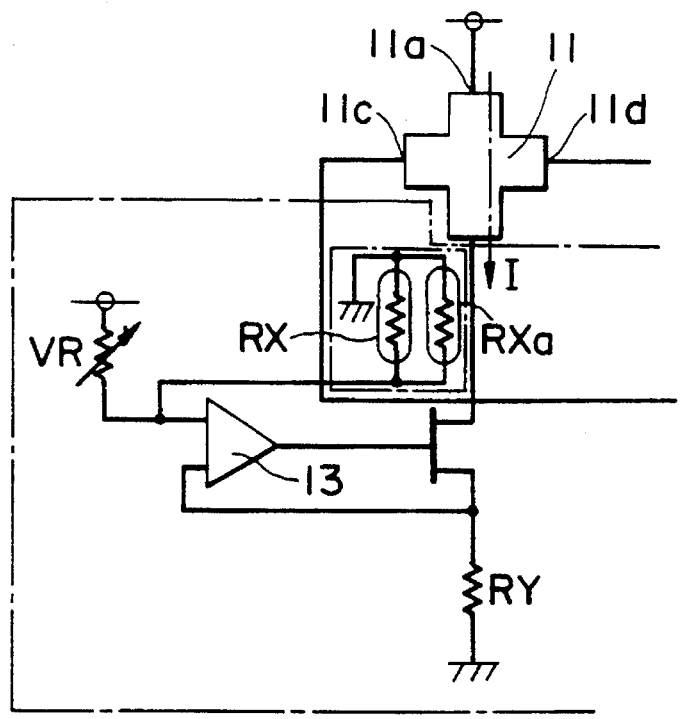
FIG. 9 is a fragmentary circuit diagram of a Hall-effect device driver according to a seventh embodiment of the present invention.

FIG. 9 fragmentarily shows a Hall-effect device driver according to a seventh embodiment of the present invention. In the Hall-effect device drive shown in FIG. 9, the resistors RX, RXa shown in FIG. 3, which have a temperature characteristic of resistance, are positioned highly closely to the Hall-effect device 11, e.g., is joined to the Hall-effect device 11. Therefore, even when the Hall-effect device 11 and the Hall-effect device driver shown in FIG. 9 are physically spaced from each other and suffer different temperature changes, the resistances of the resistors RX, RXa vary directly commensurately with the temperature-dependent change in the sensitivity of the Hall-effect device 11. Accordingly, the temperature-dependent change in the sensitivity of the Hall-effect device 11 can accurately be compensated for. The Hall-effect device drive shown in FIG. 9 operates in the same manner as the Hall-effect device drive shown in FIG. 3.

Figure 10:
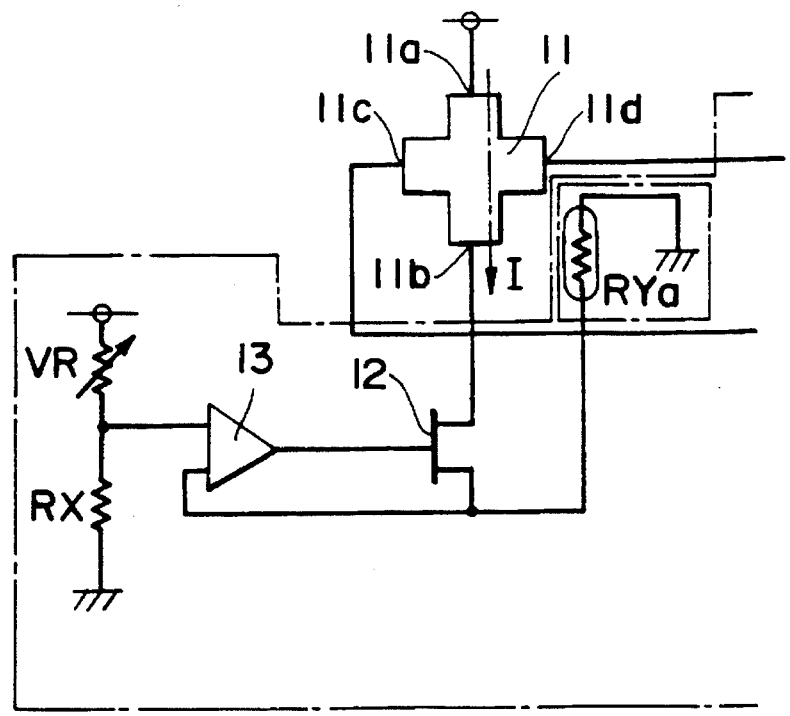
FIG. 10 is a fragmentary circuit diagram of a Hall-effect device driver according to an eighth embodiment of the present invention.

FIG. 10 fragmentarily shows a Hall-effect device driver according to an eighth embodiment of the present invention. In the Hall-effect device drive shown in FIG. 10, the resistor Rya shown in FIG. 4, which have a temperature characteristic of resistance, is positioned highly closely to the Hall-effect device 11, e.g., is joined to the Hall-effect device 11. Therefore, even when the Hall-effect device 11 and the Hall-effect device driver shown in FIG. 9 are physically spaced from each other and suffer different temperature changes, the resistance of the resistor RYa varies directly commensurately with the temperature-dependent change in the sensitivity of the Hall-effect device 11. Accordingly, the temperature-dependent change in the sensitivity of the Hall-effect device 11 can accurately be compensated for. The Hall-effect device drive shown in FIG. 10 operates in the same manner as the Hall-effect device drive shown in FIG. 4.

Figure 11:
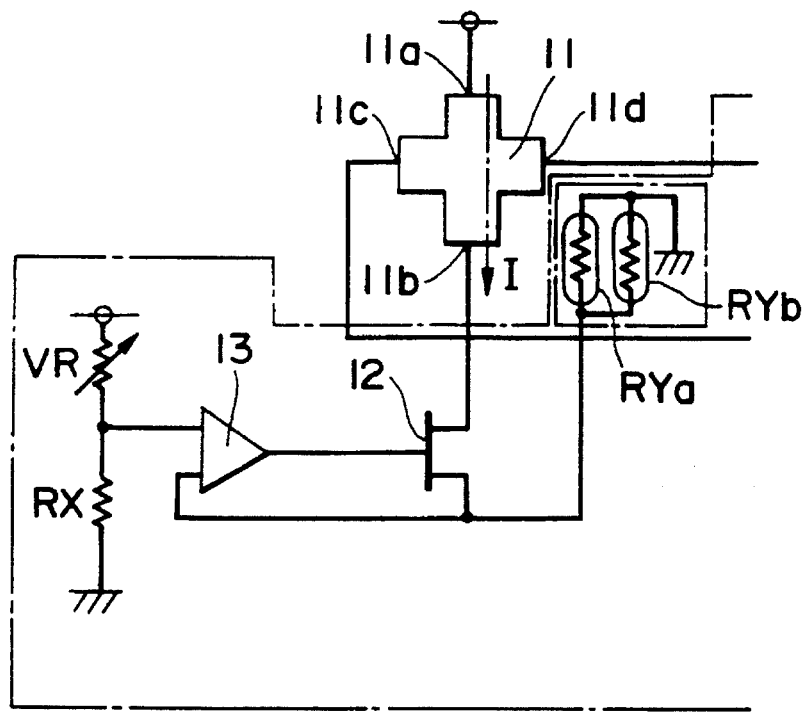
FIG. 11 is a fragmentary circuit diagram of a Hall-effect device driver according to a ninth embodiment of the present invention.

FIG. 11 fragmentarily shows a Hall-effect device driver according to a ninth embodiment of the present invention. In the Hall-effect device drive shown in FIG. 11, the resistors RYa, RYb shown in FIG. 5, which have a temperature characteristic of resistance, are positioned highly closely to the Hall-effect device 11, e.g., is joined to the Hall-effect device 11. Therefore, even when the Hall-effect device 11 and the Hall-effect device driver shown in FIG. 11 are physically spaced from each other and suffer different temperature changes, the resistances of the resistors RYa, RYb vary directly commensurately with the temperature-dependent change in the sensitivity of the Hall-effect device 11. Accordingly, the temperature-dependent change in the sensitivity of the Hall-effect device 11 can accurately be compensated for. The Hall-effect device drive shown in FIG. 11 operates in the same manner as the Hall-effect device drive shown in FIG. 5.

Figure 12:
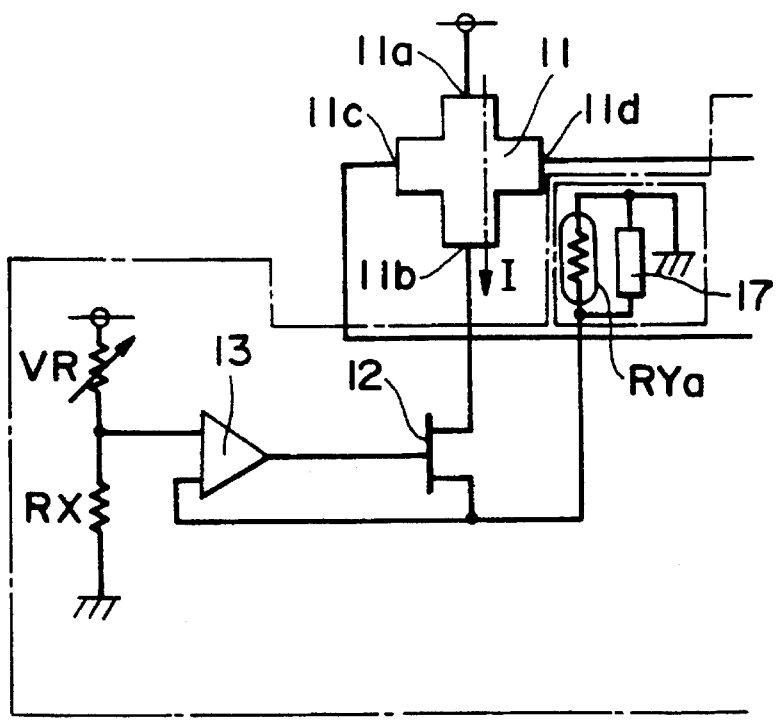
FIG. 12 is a fragmentary circuit diagram of a modification of the Hall-effect device driver according to the ninth embodiment of the present invention.

As shown in FIG. 12, the resistor RYb shown in FIG. 11 may be replaced with a thermistor 17 having a negative temperature characteristic of resistance.

Figure 13:
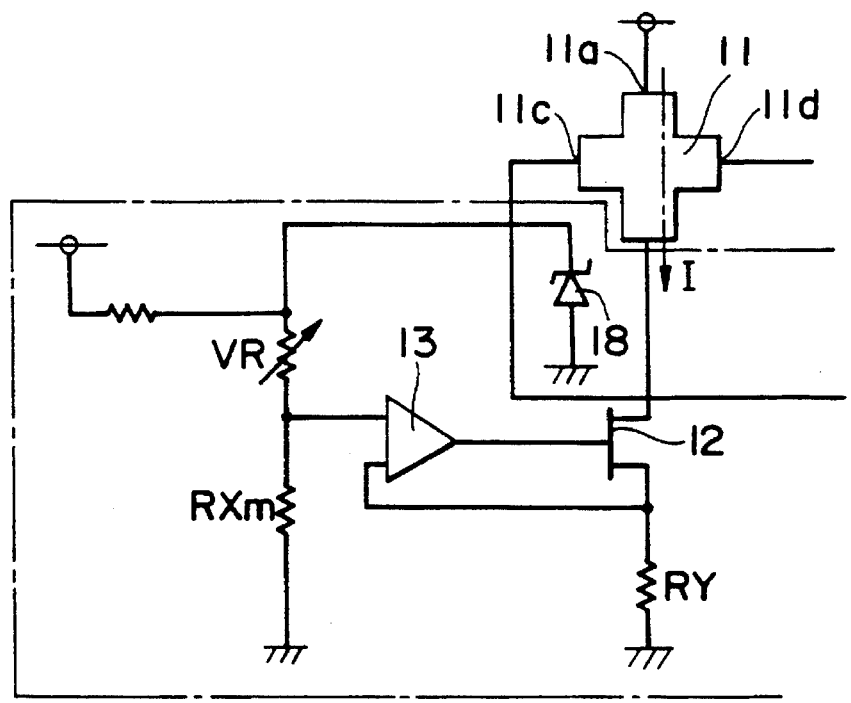
FIG. 13 is a fragmentary circuit diagram of a Hall-effect device driver according to a tenth embodiment of the present invention.

FIG. 13 fragmentarily shows a Hall-effect device driver according to a tenth embodiment of the present invention. In the Hall-effect device drive shown in FIG. 13, the constant-voltage diode 18 shown in FIG. 7, which have a positive temperature characteristic of resistance, is positioned highly closely to the Hall-effect device 11, e.g., is joined to the Hall-effect device 11. Therefore, even when the Hall-effect device 11 and the Hall-effect device driver shown in FIG. 13 are physically spaced from each other and suffer different temperature changes, the resistance of the constant-voltage diode 18 varies directly commensurately with the temperature-dependent change in the sensitivity of the Hall-effect device 11. Accordingly, the temperature-dependent change in the sensitivity of the Hall-effect device 11 can accurately be compensated for. The Hall-effect device drive shown in FIG. 13 operates in the same manner as the Hall-effect device drive shown in FIG. 7.

Figure 14:
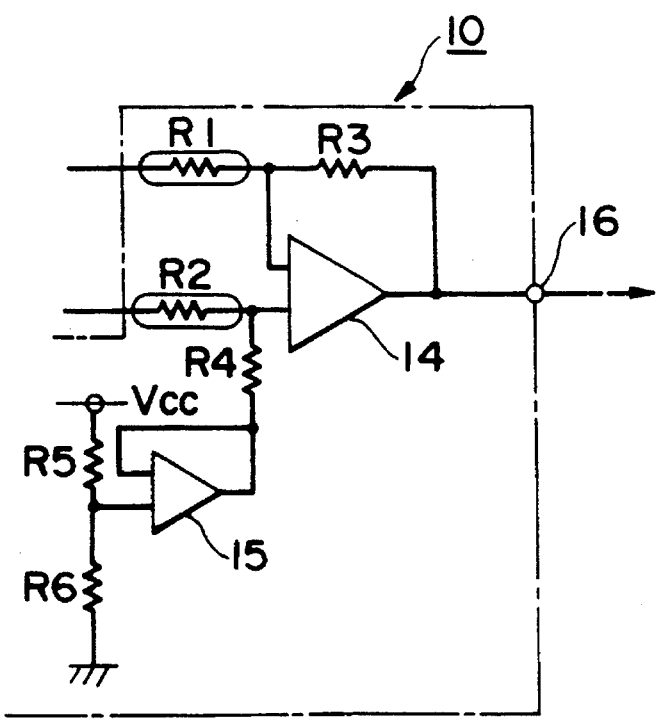
FIG. 14 is a fragmentary circuit diagram of a Hall-effect device driver according to an eleventh embodiment of the present invention.

FIG. 14 fragmentarily shows a Hall-effect device driver according to an eleventh embodiment of the present invention. The Hall-effect device driver shown in FIG. 14 has resistors R1, R2, each having a negative temperature characteristic of resistance, which are connected to the respective noninverting and inverting input terminals of the operational amplifier 14. In the Hall-effect device driver shown in FIG. 14, resistors corresponding respectively to the resistors RX, RY shown in FIG. 2 have no temperature characteristic of resistance. The other structural details of the Hall-effect device driver shown in FIG. 14 are identical to those of the Hall-effect device driver shown in FIG. 2, and are omitted from illustration.

The Hall-effect device driver shown in FIG. 14 is capable of compensating for temperature-dependent changes in the sensitivity of the Hall-effect device 11. Specifically, when the ambient temperature around the Hall-effect device 11 varies, the drive current I flowing therethrough varies, causing the voltage level of the detected signal from the output terminals 11c, 11d to vary. Since the resistances of the resistors R1, R2 also vary with the temperature, the voltage level of the detected signal applied to the noninverting and inverting input terminals of the operational amplifier 14 can be kept constant.

Figure 15:
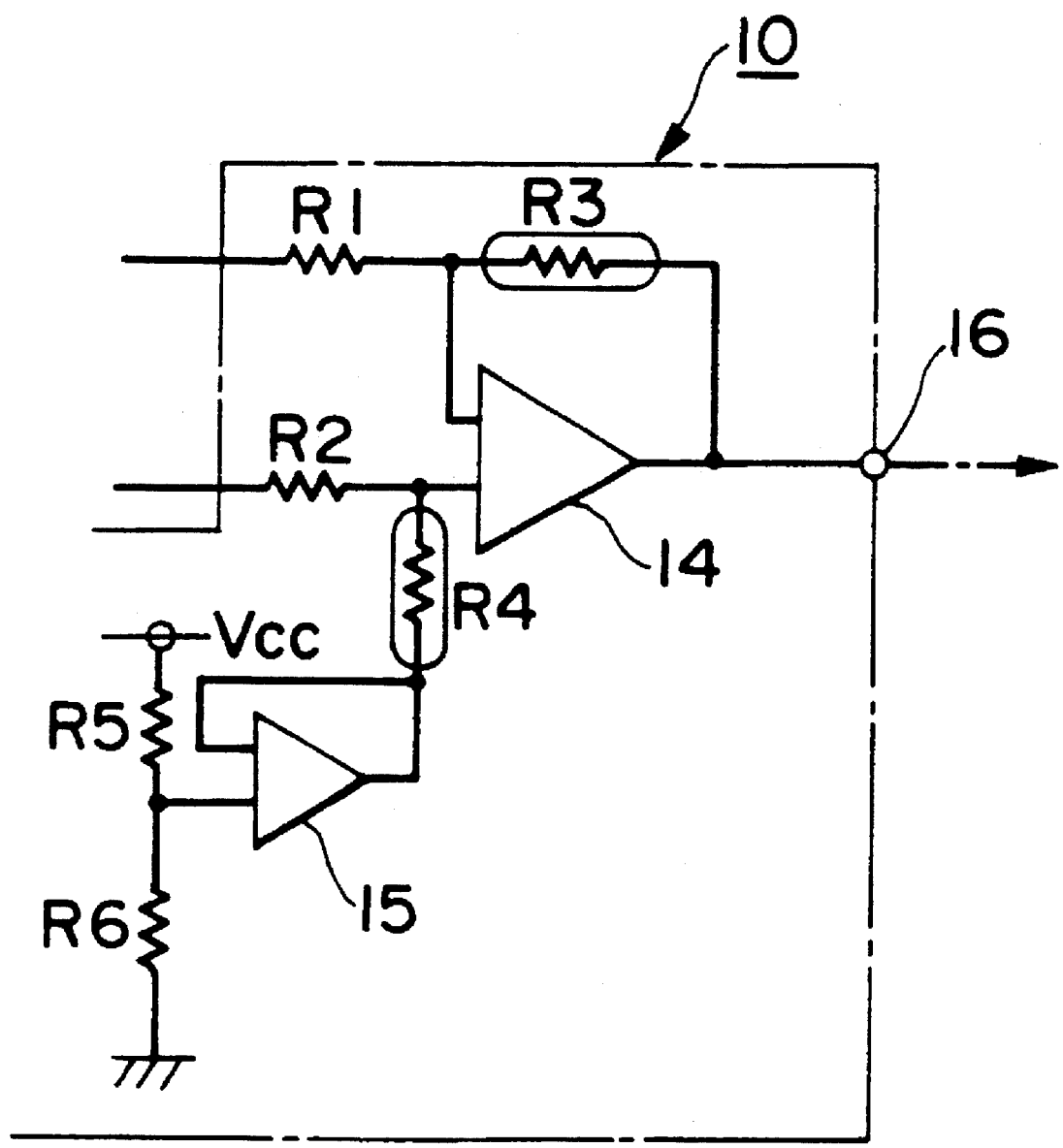
FIG. 15 is a fragmentary circuit diagram of a Hall-effect device driver according to a twelfth embodiment of the present invention.

FIG. 15 fragmentarily shows a Hall-effect device driver according to a twelfth embodiment of the present invention. The Hall-effect device driver shown in FIG. 15 has resistors R3, R4, each having a positive temperature characteristic of resistance, the resistor R3 being connected parallel to the operational amplifier 14 to determine an amplification factor thereof, and the resistor R4 being connected to the inverting input terminal of the operational amplifier 14 to determine a reference voltage thereof. The other structural details of the Hall-effect device driver shown in FIG. 15 are identical to those of the Hall-effect device driver shown in FIG. 2, and are omitted from illustration. When the detected signal from the Hall-effect device 11 varies in level as the ambient temperature varies, the voltage level of the detected signal outputted from the output terminal of the operational amplifier 14 remains constant regardless of the temperature change.

With the above arrangement of the present invention, the positive or negative temperature characteristic of sensitivity of the Hall-effect device 11 is corrected using the resistors RX, RXa, RYa, RYb, the constant-voltage diode 18, and the resistors R1, R2, R3, R4 which have a temperature characteristic of resistance that is opposite to the temperature characteristic of sensitivity of the Hall-effect device 110 Therefore, the drive current I flowing through the Hall-effect device 11 is caused to vary in a manner opposite to the sensitivity of the Hall-effect device 11 as it varies with the temperature. Consequently, the output voltage level of the flux-detected signal from the Hall-effect device 11 is uniquely determined by the intensity of magnetic fluxes to be measured, without being adversely affected by the ambient temperature.

As described above, in the embodiments shown in FIGS. 2 through 13, a change in the resistance of the temperature-dependent variable resistor, which has a temperature characteristic of resistance opposite to the positive or negative temperature characteristic of sensitivity of the Hall-effect device, is converted into a voltage change, and the converted voltage is applied as an input voltage to the semiconductor device connected to the input terminals of the Hall-effect device to compensate for a temperature-dependent change in the sensitivity of the Hall-effect device according to the positive or negative temperature characteristic thereof. Thus, the temperature characteristic of sensitivity of the Hall-effect device can accurately be corrected to produce a flux-detected signal having an accurate voltage level which represents the intensity of magnetic fluxes to be measured, without being adversely affected by the ambient temperature.

In the embodiments shown in FIGS. 14 and 15, a flux-detected signal produced from the output terminals of the Hall-effect device is supplied to the amplifier through the temperature-dependent variable resistor, or the temperature-dependent variable resistor is used to determine the amplification factor of the amplifier, thereby to correct the temperature characteristic of the Hall-effect device. Therefore, the Hall-effect device driver is simpler in arrangement, and yet can accurately correct the temperature characteristic of sensitivity of the Hall-effect device to produce a flux-detected signal having an accurate voltage level which represents the intensity of magnetic fluxes to be measured.

Although certain preferred embodiments of the present invention has been shown and described in detail, it should be understood that various changes and modifications may be made therein without departing from the scope of the appended claims.

What is claimed is:

1. A Hall-effect device driver comprising:

a semiconductor having an internal resistance connected in series to one of a pair of voltage-applying terminals of a Hall-effect device which has a positive or negative temperature characteristic of sensitivity, said internal resistance being variable depending on an input voltage applied thereto;

a temperature-dependent variable resistor having a temperature characteristic of resistance which is opposite to said positive or negative temperature characteristic of sensitivity of said Hall-effect device;

voltage converting means for converting a change in the resistance of said temperature-dependent variable resistor into a voltage change and applying said voltage change as the input voltage to said semiconductor device for correcting said positive or negative temperature characteristic of sensitivity of said Hall-effect device, said voltage converting means comprising an operational amplifier;

a resistor connected to limit a drive current flowing through the Hall-effect device; and a variable resistor connected to said temperature-dependent variable resistor to divide a voltage and apply the divided voltage to an input terminal of said operational amplifier;

wherein said semiconductor device being connected to said operational amplifier such that a voltage drop developed across said resistor is applied to another input terminal of said operational amplifier, whereby the drive current flowing through said Hall-effect device is controlled.

2. A Hall-effect device driver according to claim 1, further comprising a second resistor having a temperature characteristic approximating zero connected parallel to the first-mentioned temperature-dependent variable resistor and in series with said variable resistor.

3. A Hall-effect device driver according to claim 1, wherein said temperature-dependent variable resistor is substantially joined to said Hall-effect device.

4. A Hall-effect device driver according to claim 2, wherein said temperature-dependent variable resistor is substantially joined to said Hall-effect device.

5. A Hall-effect device driver according to claim 2, wherein said first-mentioned and second temperature-dependent variable resistors are substantially joined to said Hall-effect device.

6. A Hall-effect device driver, comprising:

a semiconductor having an internal resistance connected in series to one of a pair of voltage-applying terminals of a Hall-effect device which has a positive or negative temperature characteristic of sensitivity, said internal resistance being variable depending on an input voltage applied thereto;

a temperature-dependent variable resistor having a temperature characteristic of resistance which is opposite to said positive or negative temperature characteristic of sensitivity of said Hall-effect device, said temperature-dependent variable resistor being connected to limit a drive current flowing through the Hall-effect device;

voltage converting means for converting a change in the resistance of said temperature-dependent variable resistor into a voltage change and applying said voltage change as the input voltage to said semiconductor device for correcting said positive or negative temperature characteristic of sensitivity of said Hall-effect device, said voltage converting means comprising an operational amplifier;

a resistor; and a variable resistor connected to said resistor to divide a voltage and apply the divided voltage to an input terminal of said operational amplifier;

wherein said semiconductor device being connected to said operational amplifier such that a voltage drop developed across said temperature-dependent variable resistor is applied to another input terminal of said operational amplifier, whereby the drive current flowing through said Hall-effect device is controlled.

7. A Hall-effect device driver according to claim 6, wherein said temperature-dependent variable resistor is a first temperature-dependent variable resistor, and said Hall-effect device driver further comprising a second resistor having a temperature characteristic of resistance which is much smaller than a temperature characteristic of resistance of the first temperature-dependent variable resistor, and connected in parallel with the first temperature-dependent variable resistor and connected in series with said semiconductor device.

8. A Hall-effect device driver according to claim 6, wherein said temperature-dependent variable resistor is substantially joined to said Hall-effect device.

9. A Hall-effect device driver according to claim 7, wherein said first-mentioned and second temperature-dependent variable resistors are substantially joined to said Hall-effect device.

10. A Hall-effect device driver according to claim 7, wherein said first temperature-dependent variable resistor is substantially joined to said Hall-effect device.

11. A Hall-effect device driver comprising:

a semiconductor having an internal resistance connected in series to one of a pair of voltage-applying terminals of a Hall-effect device which has a positive or negative temperature characteristic of sensitivity, said internal resistance being variable depending on an input voltage applied thereto;

a constant-voltage diode having a temperature characteristic of resistance which is opposite to said positive or negative temperature characteristic of sensitivity of said Hall-effect device; and voltage converting means for converting a change in the voltage across said constant-voltage diode into a voltage change and applying said voltage change as the input voltage to said semiconductor device for correcting said positive or negative temperature characteristic of sensitivity of said Hall-effect device wherein the drive current flowing through said Hall-effect device is controlled by said semiconductor device.

12. A Hall-effect device driver according to claim 11, wherein said constant-voltage diode is substantially joined to said Hall-effect device.

* * * * *